United States Patent [19]

Dargent

[11] Patent Number: 4,533,431
[45] Date of Patent: Aug. 6, 1985

[54] PROCESS FOR PRODUCING CONDUCTORS FOR INTEGRATED CIRCUITS USING PLANAR TECHNOLOGY

[75] Inventor: Bruno Dargent, Grenoble, France
[73] Assignee: Commissariat a l'Energie Atomique, Paris, France
[21] Appl. No.: 570,506
[22] Filed: Jan. 13, 1984
[30] Foreign Application Priority Data
Jan. 13, 1983 [FR] France ................ 83 00436
[51] Int. Cl.³ .............. B44C 1/22; C03C 15/00; C03C 25/06; C23F 1/02
[52] U.S. Cl. .................... 156/643; 156/652; 156/656; 156/657; 156/661.1; 204/192 E; 427/131; 427/132; 427/259
[58] Field of Search ............. 156/643, 652, 653, 656, 156/659.1, 661.1, 657; 204/192 EC, 192 E, 15, 32 R; 427/130, 131, 132, 250, 259

[56] References Cited

U.S. PATENT DOCUMENTS 4,224,361 9/1980 Romankiw .................. 427/259
4,391,849 7/1983 Bischoff .................. 156/657 X

FOREIGN PATENT DOCUMENTS 0022580 1/1981 European Pat. Off. .
0057738 8/1982 European Pat. Off. .
2452762 10/1980 France .

OTHER PUBLICATIONS

Journal of the Electrochemical Society, vol. 125, No. 6, Jun. 1978, pp. 860-865, entitled Electrochemical Aspects of the Beveling of Sputtered Permalloy Films by J. J. Kelly and G. J. Koel.

Primary Examiner—William A. Powell
Attorney, Agent, or Firm—Cesari and McKenna

[57] ABSTRACT

The invention relates to a process for producing conductors for integrated circuits using planar technology.

According to this process, on a substrate is deposited an insulating material coating. A masking sheet is deposited on the insulating material coating and this sheet is cut to form windows corresponding to the conductors to be obtained. The insulating material sheet is etched facing the windows. A conductive material is deposited on the cut masking sheet. The masking sheet and the conductive material covering it are removed. This process consists of choosing a masking sheet having a first coating covering the insulating material coating and a second masking coating covering the first coating. The first coating is cut chemically facing the windows and after cutting the second masking coating, the edges of the first coating on the periphery of the windows are eroded by chemical cutting.

Application to the production of planar integrated circuits.

6 Claims, 6 Drawing Figures

PROCESS FOR PRODUCING CONDUCTORS FOR INTEGRATED CIRCUITS USING PLANAR TECHNOLOGY

BACKGROUND OF THE INVENTION

The present invention relates to a process for producing conductors for integrated circuits using planar technology. It is applicable to the field of microelectronics and more specifically to the production of integrated circuits. It more specifically relates to conductors, which can be buried in a silicon oxide coating, e.g. carried by a magnetic garnet substrate for producing magnetic bubble stores.

The process of the invention essentially consists of making conductive deposits buried in an insulant covering a substrate, in such a way that these conductive deposits have no relief above the substrate surface. Thus, this process can be used in the production of planar integrated circuits.

A process for producing conductors for planar integrated circuits is already known and is for example described in the journal IEEE TRANSACTIONS AND ELECTRONIC DEVICES, vol. ED 2, no. 6, June 1980, article by B. M. WELCH entitled: "LSI processing technology for planar GaAs integrated circuits". This process is illustrated by the present FIG. 1. It essentially consists of depositing on a substrate 1 a coating of an insulating material 2 (e.g. silicon), followed by the deposition thereon of a masking coating 3 (e.g. of resin). This masking coating is then cut out down to the insulating material coating e.g. by irradiation through a mask. This cutting process makes it possible to obtain windows 4 in the masking coating and which correspond to the conductors to be obtained. This is followed by the etching of patterns in the insulating material coating 2 facing windows 4, e.g. by reactive ionization. This reactive ionization is well known and essentially consists of etching by ionization the insulating material coating, e.g. in a gaseous atmosphere. When the insulating material coating 2 has been etched, a conductive material 5 is then deposited on the masking coating and in the patterns etched in the insulating material coating 2. This is followed by the removal of the masking coating 3 and the conductive material covering the same, e.g. by dissolving the masking coating in a solvent (e.g. acetone) in the presence of ultrasonics. Masking coating lift-off is difficult if the conductive coating covering the same also covers the edges of the windows cut into the masking coating and reaches the insulating material coating 2. In order to successfully carry out lift-off of the masking coating by dissolving in a solvent, it is necessary for the edges of the masking coating to be vertical in the vicinity of the windows, which it is very difficult to ensure with conventional lithography means. If not and particularly when reactive ionic etching leads to a hardening of the masking coating surface, it is very difficult to dissolve this coating without the use of violent mechanical means, such as e.g. high pressure jets or brushing. The deposition of the conductive coating must be highly directional, so as not to cover the edges of the masking coating in the vicinity of the windows.

Another process for producing conductors for planar integrated circuits is known and is described in the journal IEEE TRANSACTIONS ON MAGNETICS, vol. MAG 16, no. 3, May 1980, article by Bernard J. ROMAN, entitled "Effect of conductor crossing on propagation". This process is illustrated by FIG. 2 and essentially consists of depositing an insulating material coating 2 on a substrate coating 1. This is followed by the deposition on said insulating material coating of a masking coating 3 (e.g. of resin), which is then cut by irradiation through a mask. This is followed by the etching of patterns in the insulating material coating 2, e.g. by reactive ionization, facing the windows 4 cut into the masking coating 3. This etching of the insulating material must be lateral, so as to bring about an increase in the dimensions of the patterns etched in the insulating coating compared with the dimension of the windows cut in the masking coating. This is followed by the deposition on said masking coating and on the bottom of the patterns etched in the insulating material coating 2 of a conductive material 5. This is followed by the removal of the masking coating and the conductive material covering the same by chemical etching of the masking coating.

The enlargement of the etched patterns in the insulating material coating by lateral etching leads to a poor definition of the dimensions of the conductors to be obtained. Moreover, an extra thickness of conductive material deposited in the etched patterns may lead to the formation of a junction between the coating of material to be deposited on the bottom of the patterns and the coating of material deposited on the masking coating. This junction will make it difficult to remove the masking coating by a solvent at the end of the process.

SUMMARY OF THE INVENTION

The object of the process according to the present invention is to obviate these disadvantages and more particularly to facilitate the elimination or lift-off of the masking means and the conductive material covering the same at the end of the production operations.

This process more particularly makes it possible to prevent a junction between the coating of the material deposited in the patterns etched in the insulating coating and the conductive material deposited on the masking coating. These objectives are achieved through the use of a supplementary masking coating, which can be chemically etched.

The present invention therefore specifically relates to a process for producing conductors for integrated circuits using planar technology, wherein a coating of an insulating material is deposited on a substrate, a masking sheet is deposited on the insulating material coating, windows corresponding to the conductors to be obtained are cut from this masking sheet down to the insulating material coating, the insulating material coating is etched facing the windows, a conductive material is deposited on the masking sheet and in the etched parts of the insulating material coating facing the windows, the masking sheet and the conductive material covering the same are removed, wherein it comprises choosing a masking sheet having a first coating covering the insulating material coating, and a second masking coating covering the first coating, the first coating being chemically cut facing the windows and after cutting the second masking coating, the edges of the first coating, on the periphery of the windows are eroded by chemical cutting.

According to another feature, the first coating is a metallic coating, which is chemically cut by a solvent.

According to another feature, the second masking coating is a resin cut along said windows by irradiation through a mask.

According to another feature, the insulating material coating is etched by a reactive ionic etching method.

According to another feature, the masking sheet and the conductive material covering the same are removed chemically.

According to yet another feature, the process also consists of using an iron and nickel alloy for forming the first coating of the masking sheet.

BRIEF DESCRIPTION OF THE DRAWING

The invention is described in greater detail hereinafter relative to non-limitative embodiments and with reference to the drawings, wherein show.

DETAILED DESCRIPTION OF THE PREFERRED EMBODIMENTS

Figure 1:
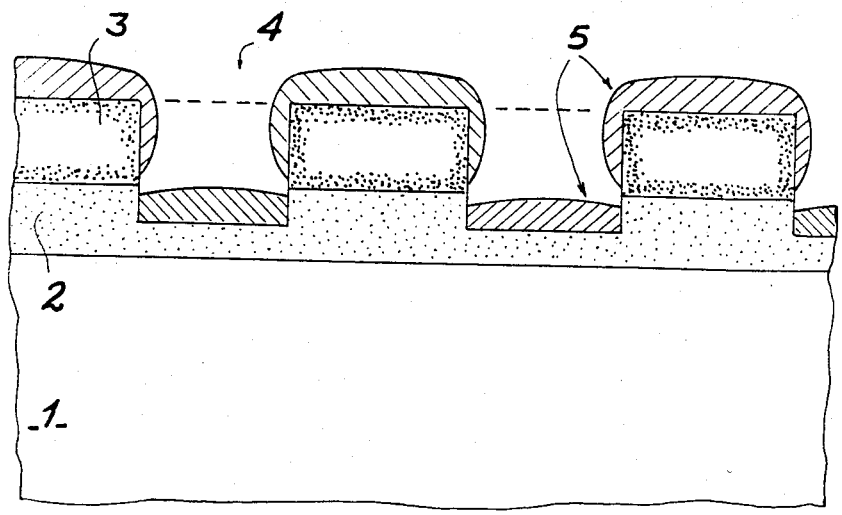
FIG. 1 already described, a process according to the prior art.
Figure 2:
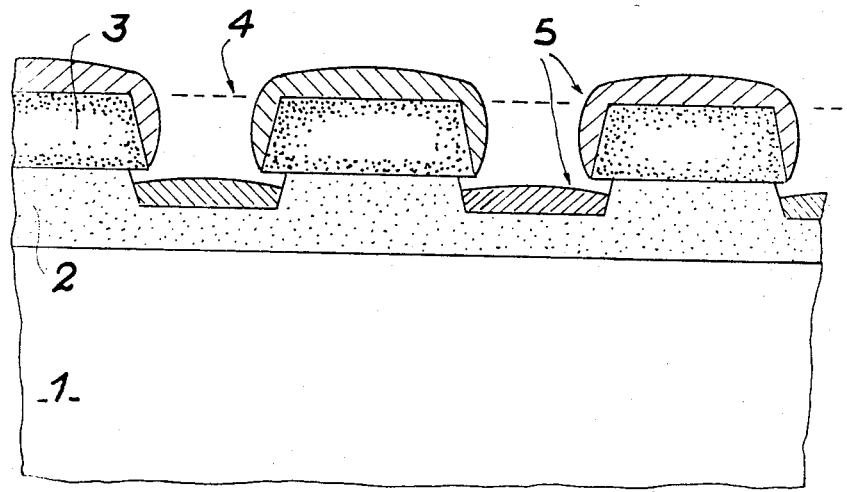
FIG. 2 already described, another process according to the prior art.

FIGS. 1 and 2 have already been described to provide a better understanding of the essential processes according to the prior art.

Figure 3A:
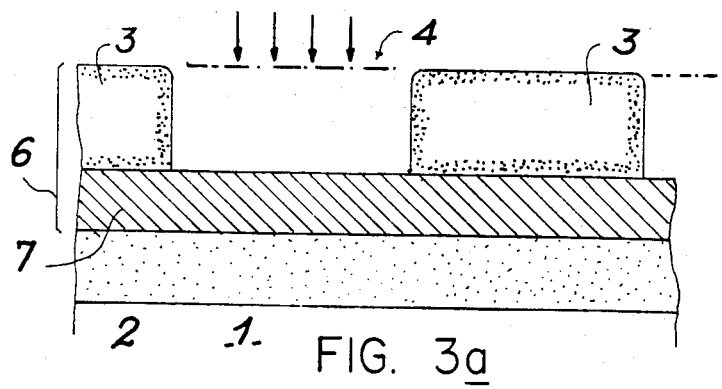
FIGS. 3a to 3d illustrate diagrammatically the main stages of the process according to the invention.

As is shown at (a) in FIG. 3a, the process firstly consists of depositing on a substrate 1 (such as a magnetic garnet in the case of producing conductors for a bubble store), a coating 2 of an insulating material, such as e.g. silicon oxide. On insulating material coating 2 is then deposited a masking sheet 6, which, as will be shown in greater detail hereinafter, consists of a first coating 7 of a material which can be chemically cut, and a second coating 3 which can be cut by irradiation through a mask. The cutting of the second coating 3 makes it possible to obtain windows corresponding to the locations of the conductors to be buried in the patterns etched in the insulating material coating 2. Masking coating 3 can e.g. be of resin.

Figure 3B:
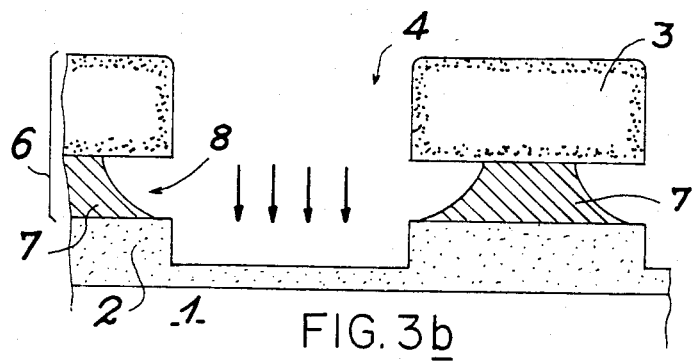

Then, and as is shown in FIG. 3b, following the cutting of masking coating 3, coating 7 which can be in the form of a metallic coating (e.g. a nickel and iron alloy) is chemically cut by means of a solvent. This chemical cutting which takes place facing wondows 4 of masking coating 3, makes it possible to erode the edges 8 of the first coating 7 of the masking sheet 7 over the periphery thereof, so that over the entire periphery the edges of the first masking coating 7 are set back compared with the borders of the second masking coating 3. The chemical etching of the first metallic coating 7 obviously requires the use of an appropriate solvent deposited on said coating facing each window 4.

This is followed by etching by reactive ionization, e.g. in a gaseous trifluoromethane atmosphere of patterns, corresponding to the location of the conductors to be obtained in the insulating material coating 2. This reactive ionization is obviously controlled as a function of the desired thickness of the conductors.

Figure 3C:
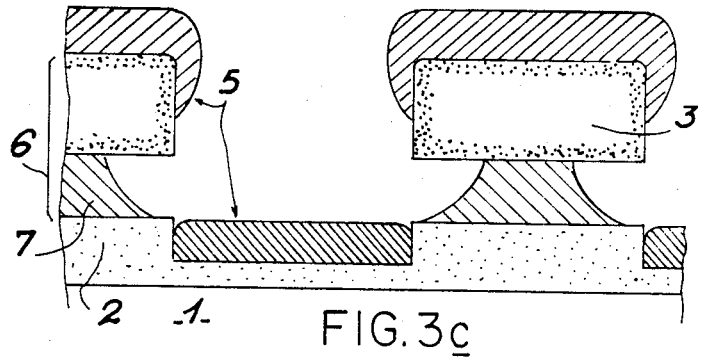

Then, and as is shown in FIG. 3c, a conductive material 5 (e.g. gold) is deposited in the etched patterns, as well as on the second masking coating 3.

Figure 3D:
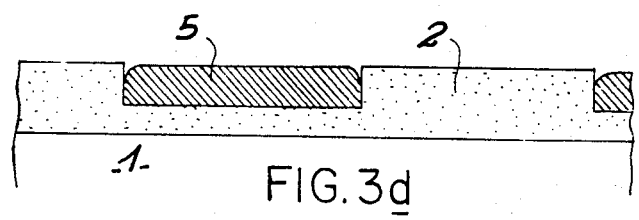

Finally, and as is shown in FIG. 3d, the first metallic coating 7, the second masking coating 3 and the material 5 covering said masking coating are chemically lifted off. This gives a substrate 1 covered with the insulating material coating 2, in which are buried the conductors 5. Thus, the implantation of conductors using planar technology has taken place and this is particularly advantageous in bubble stores. The masking material coating 3 can e.g. be an acetone-soluble resin. For example, coating 3 can have a thickness of 1μ, whilst the second iron-nickel coating 7 can have a thickness of 5,000 Å. The thickness of the conductors 5 deposited in the patterns etched in the insulating material coating 2 can be 2,700 Å, whilst the thickness of said insulating coating is close to 3,000 Å. This production process is particularly useful in connection with bubble stores, although it can be used in the production of other circuits.

What is claimed is:

1. A process for producing conductors for integrated circuits using planar technology, wherein a coating of an insulating material is deposited on a substrate, a masking sheet is deposited on the insulating material coating, windows corresponding to the conductors to be obtained are cut from this masking sheet down to the insulating material coating, the insulating material coating is etched facing the windows, a conductive material is deposited on the masking sheet and in the etched parts of the insulating material coating facing the windows, the masking sheet and the conductive material covering the same are removed, the improvement wherein the masking sheet is deposited as a metallic coating covering the insulating material and a resin coating covering the metallic coating and the windows are cut from the masking sheet by first cutting the resin coating along the windows and then undercutting the metallic coating along the windows so that the edges of the metallic coating on the peripheries of the windows are set back from the corresponding edges of the resin coating thereby avoiding conductive material bridging between the masking sheet and the etched parts of the insulating material facing the windows that could inhibit removal from the substrate of the masking sheet and the conductive material covering the same.

2. A process according to claim 1, wherein the metallic coating is chemically cut by means of a solvent.

3. A process according to claim 1, wherein the resin coating is cut along the windows by irradiation through a mask.

4. A process according to claim 3, wherein the insulating material coating is etched by reactive ionic etching.

5. A process according to claim 4, wherein the masking sheet and the conductive material covering said sheet are removed chemically.

6. A process according to claim 5, wherein the metallic coating of the masking sheet is formed by alloying iron and nickel metals.

* * * * *